United States Patent [19]

Urushiyama

[11] 4,287,667

[45] Sep. 8, 1981

[54] METHOD OF MOUNTING AN ELECTRICAL COMPONENT

[75] Inventor: Masayuki Urushiyama, Tamayama, Japan

[73] Assignee: Alps Electric Co., Ltd., Tokyo, Japan

[21] Appl. No.: 104,817

[22] Filed: Dec. 18, 1979

[30] Foreign Application Priority Data

Dec. 20, 1978 [JP] Japan .................................. 53-15829

[51] Int. Cl.³ ............................................. H05K 3/34
[52] U.S. Cl. ...................................... 29/837; 29/840; 156/250
[58] Field of Search ................. 29/832, 834, 835, 836, 29/842, 844, 845, 840, 837; 361/346, 401, 404, 405; 156/250, 251, 252; 174/52 R

[56] References Cited

U.S. PATENT DOCUMENTS 3,486,224 12/1969 Chaney .............................. 361/405
4,019,141 4/1977 Numan et al. ................ 174/52 R X
4,144,555 3/1979 McGalliard .................... 361/401 X

FOREIGN PATENT DOCUMENTS 52-11801 1/1977 Japan ..................................... 29/840

Primary Examiner—Nicholas P. Godici
Assistant Examiner—C. J. Arbes
Attorney, Agent, or Firm—Guy W. Shoup; Gerard F. Dunne

[57] ABSTRACT

A method of mounting an electrical component to a printed circuit board or the like is described which comprises the steps of inserting terminals of the electrical component through a printed circuit board, fixing the terminals extending beyond the rear surface of the p.c. board by immersion soldering, and thereafter removing a removable portion of the p.c. board provided under or near the electrical component and surrounded with a slit, to provide an opening in the printed circuit board.

3 Claims, 6 Drawing Figures

METHOD OF MOUNTING AN ELECTRICAL COMPONENT

BACKGROUND OF THE INVENTION

1. Field of the Invention

The present invention relates to a method of mounting an electrical component to a printed circuit board. More particularly, it relates to a method of mounting an electrical component on a printed circuit board having an opening near where the component is mounted to the board for allowing the output or the like of the component to be adjusted.

2. Description of the Prior Art

One form of electrical component mounted to a printed circuit board in this manner is a miniature variable capacitor of the type used in the tuning of AM radio receivers or the like. Such capacitors have their terminals and operating rods protruding in the same direction and after mounting the variable capacitor on a printed circuit board, the operating rod is operated from the rear side of the board through the opening therein. Thus, an appliance equipped to carry such a miniature variable capacitor has an enhanced efficiency for the mounting of the capacitor to the printed circuit board, and has reduced space requirements.

Prior art methods of mounting electrical components of this type are illustrated in FIGS. 1 and 2 of the accompanying drawings. An opening 3 for operating a rod 4 is provided in a printed circuit board 1 in advance. Connecting terminals 5 and grounding terminals 6 of a miniature variable capacitor 2 are inserted through respective apertures in the board 1. A conductive pattern on the rear side of the board 1 and the respective terminals 5 and 6 of the variable capacitor 2 are connected and fixed at one time by the use of immersion soldering (automatic soldering). Since, however, the operating rod 4 and a part of the variable capacitor 2 face towards the soldering bath through the opening 3, solder and solvent must be prevented from adhering to the operating rod 4 or entering the interior of the variable capacitor 2 through a bearing portion or the like to deteriorate the performance of the capacitor. To this end, the rod 4 is normally covered with a heat resistant cap 7 as illustrated in FIG. 1, or a heat resistant tape 8 is used to close the opening 3 as illustrated in FIG. 2.

The prior art methods are accordingly disadvantageous in that the step of depositing the heat resistant cap 7 or the heat resistant tape 8 before the soldering, and the step of detaching the cap 7 or the tape 8 after the soldering are required and the job is thereby complicated. A more serious disadvantage is that an extra part in the form of the cap 7 or the tape 8 is originally required.

SUMMARY OF THE INVENTION

The present invention has been made in order to eliminate the aforecited disadvantages, and has for its object to provide a method of mounting an electrical component which can protect the electrical component from heat generated in the immersion soldering step, the upward migration of a solvent, etc. without the necessity for any separate part, and to do so with a high job efficiency.

According to one aspect of performance of the method of the present invention for mounting an electrical component, which has an operating portion and a plurality of terminals, on a printed circuit board whose rear surface is formed with a printed conductive pattern, the p.c. board is formed with apertures for inserting the terminals therethrough and is also provided with a removable portion in a position opposing the operating portion of the electrical component. The method comprises the step of inserting the terminals of said electrical component through the terminal inserting apertures in the p.c. board, the step of soldering the terminals extending beyond the rear surface of p.c. board by immersion soldering, and the step of removing the removable portion of the p.c. board so as to make the operating portion of the electrical component operable from the rear surface side of the board.

BRIEF DESCRIPTION OF THE DRAWINGS

FIGS. 3 to 5 illustrate an embodiment of the present invention, in which FIG. 3 is a front view, with essential portions taken in section, showing a state before soldering, FIG. 4 is a plan view of a printed circuit board used in the illustrated embodiment, and FIG. 5 is a front view, with essential portions taken in section, showing a state after removing a removable portion of the printed circuit board.

DESCRIPTION OF THE PREFERRED EMBODIMENTS

Figure 1:
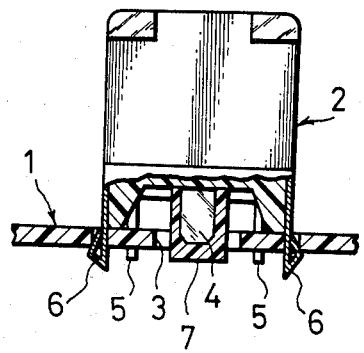
FIGS. 1 and 2 are front views of the prior art, with essential portions taken in sections.
Figure 2:
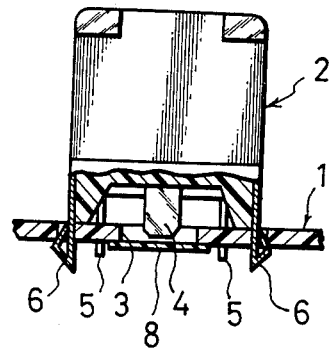
Figure 3:
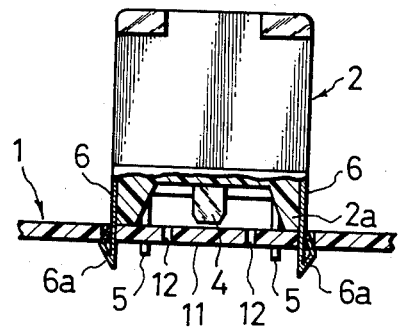
Figure 5:
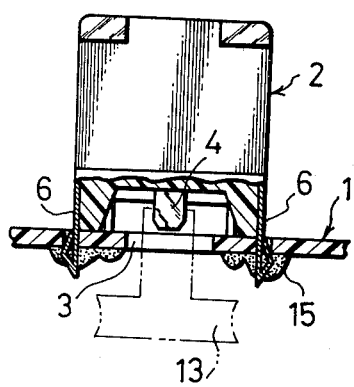
Figure 4:
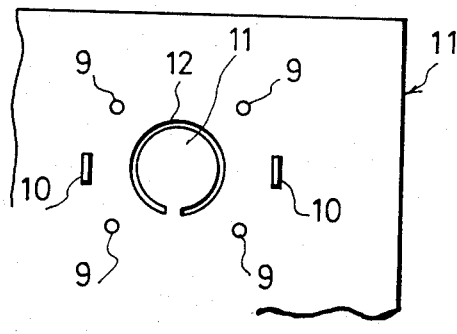

The present invention will now be described in conjunction with an embodiment illustrated in FIGS. 3 to 5.

Referring to the figures, numeral 2 designates a miniature variable capacitor, numeral 4 an operating rod, numeral 5 terminals for connecting the capacitor with a peripheral circuit, numeral 6 resilient terminals for grounding, numeral 1 a printed circuit board for mounting the variable capacitor 2 thereon, numeral 9 apertures for inserting the terminals 5 therethrough, numeral 10 apertures for inserting the terminals 6 therethrough, and numeral 11 a portion to be removed (removable portion) which is provided in a position corresponding to the operating rod 4 and the greater part of which is surrounded with a slit 12.

In mounting the variable capacitor 2, first of all, the terminals 5 and 6 of the variable capacitor 2 are respectively inserted into the apertures 9 and 10 and a pedestal portion 2a of the variable capacitor 2 is caused to abut upon the p.c. board 1, to position the variable capacitor, and the variable capacitor 2 is temporarily fixed to the board 1 by exploiting the elastic forces of bent portions 6a of the grounding terminals 6. In this case, the protuberant length of the operating rod 4 is set to be less than those of the terminals 5 and 6. Therefore, the rod 4 does not abut upon the p.c. board 1.

Thereafter, the p.c. board 1, on which the variable capacitor 2 and other electrical components (not shown) are carried, is transported to a soldering bath by means of a belt conveyor or the like, and the terminals 5 and 6 projecting on the rear side of the p.c. board 1 and a conductive pattern (not shown) formed on the rear surface of the board 1 are connected and fastened by soldering indicated at numeral 15. Since, in this case, width of the slit 12 is very narrow, it is not feared that the solder and a solvent will permeate above the p.c. board 1 through the slit 12. In addition, the immersion soldering is not executed under the state under which the opening 3 is provided as in the prior arts, so that the variable capacitor 2 and other electrical components susceptible to heat, vapor etc. carried on the p.c. board 1 are not damaged by the heat, vapor etc. during the soldering.

The portion to be removed 11 surrounded with the slit 12 is removed by inserting an appropriate tool, such as the tip of a screwdriver or the like, into the slit 12, thereby to provide an opening 3. A pulley 13, for example, is fixed to the operating rod 4 through the opening 3. Then, the assemblage terminates.

Figure 6:
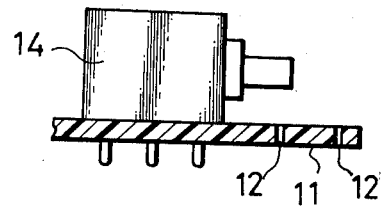
FIG. 6 is a schematic sectional view of essential portions showing another embodiment of the present invention.

In the above embodiment, there has been explained the example in which the portion to be removed 11 is provided under the variable capacitor 2 (electrical component). In some cases, however, the portion to be removed 11 is provided in the vicinity of an electrical component 14 as illustrated in FIG. 6. In addition, the slit is not restricted to the continuous shape shown in FIG. 4, but it is sometimes formed of a large number of smaller slits. Essentially, the slit may be in any shape facilitating the removal of the portion to be removed, and various modifications are considered to be within the scope of the present invention.

As set forth above, according to the present invention, the portion to be removed protects the electrical component during the immersion soldering. Therefore, it is not feared that the solder and the solvent will adhere to the electrical component or that the electrical component will be damaged by heat or vapor during the soldering, and the separate protective parts as in the prior arts are not required in the step of the immersion soldering. Moreover, the single simple step of providing the opening merely by removing a portion made easily removable due to the slit suffices in contrast to the operations of attaching and detaching the separate part for protection. Therefore, the job efficiency is high.

What is claimed is:

1. A method for mounting an electrical component having an operating portion and a plurality of terminals to a substrate having its surface formed with a printed circuit pattern and formed with apertures for receiving said terminals therethrough, said substrate being provided with a removable portion opposite to an operating portion of the electrical component, the method comprising the steps of:

inserting said terminals of said electrical component through the respective apertures in said substrate, soldering the terminals extending beyond the rear surface of said substrate by immersion soldering, and removing said removable portion of said substrate so as to make said operating portion to said electrical component operable from the rear surface side of said substrate.

2. A method as defined in claim 1, wherein most of said removable portion is surrounded with a single slit which penetrates through said substrate from the front surface to the rear surface thereof.

3. A method as defined in claim 1, wherein said removable portion is surrounded with a plurality of discontinuous slits which penetrate through said substrate from the front surface to the rear surface thereof.

* * * * *